US007110428B2

(12) United States Patent
Jagadish et al.

(10) Patent No.: US 7,110,428 B2
(45) Date of Patent: Sep. 19, 2006

(54) VERTICAL CAVITY SURFACE EMITTING LASER

(75) Inventors: Chennupati Jagadish, Evatt (AU); Michael Israel Cohen, O'Connor (AU)

(73) Assignee: The Australian National University, Australian Capital Territory (AU)

(*) Notice: Subject to any disclaimer, the term of this patent is extended or adjusted under 35 U.S.C. 154(b) by 25 days.

(21) Appl. No.: 10/434,610

(22) Filed: May 9, 2003

(65) Prior Publication Data

US 2004/0037337 A1 Feb. 26, 2004

Related U.S. Application Data

(63) Continuation of application No. PCT/AU01/01460, filed on Nov. 9, 2001.

(30) Foreign Application Priority Data

Nov. 9, 2000 (AU) .................................. PR1377

(51) Int. Cl.
*H01S 5/00* (2006.01)
(52) U.S. Cl. ................. 372/44.01; 372/46.01
(58) Field of Classification Search ............ 372/44, 372/45, 46, 29.015, 44.01, 45.01, 46.01
See application file for complete search history.

(56) References Cited

U.S. PATENT DOCUMENTS

| 5,238,868 A | 8/1993 | Elman et al. ............ 372/46 |
| 5,778,018 A * | 7/1998 | Yoshikawa et al. ............ 372/45 |
| 5,864,575 A * | 1/1999 | Ohiso et al. ............ 372/96 |
| 6,044,100 A | 3/2000 | Hobson et al. ............ 438/511 |
| 6,351,482 B1 * | 2/2002 | Puzey ............ 372/99 |

OTHER PUBLICATIONS

Ide et al. "Continuous Output Beam Steering in Vertical-Cavity Surface-Emitting Lasers with Two p-Type Electrodes by Controlling Injection Current Profile," Japanese Journal of Applied Physics, vol. 38, part I, No. 4A, Apr. 1999, pp. 1966-1970.*
IEEE Photonics Technology Letters, vol. 13, No. 6, Jun. 2001, *Electrically Steerable Lasers Using Wide-Aperture VCSELS*, Cohen, et al., pp. 544-546.
IEEE Photonics Technology Letters, vol. 11, No. 7, Jul. 1999, *Current-Induced Guiding and Beam Steering in Active Semiconductor Planar Waveguide*, Dong, et al., pp. 809-811.
IEEE Photonics Technology Letters, vol. 9, No. 4, Apr. 1997, *Dynamic Beam Switching of Vertical-Cavity Surface-Emitting Lasers with Integrated Optical Beam Routers*, Fan, et al, pp. 505-507.

* cited by examiner

Primary Examiner—James Menefee
(74) Attorney, Agent, or Firm—Knobbe, Martens, Olson & Bear, LLP

(57) ABSTRACT

A vertical cavity surface emitting laser, including an active region, an electrical contact for injecting current into the active region in order to generate photons, and an aperture between the active region and the contact for restricting current flow into the active region. The aperture is sufficiently large in at least one transverse dimension for the active region to support multiple transverse modes, and the aperture and contact are configured to produce current crowding in the active region. The direction of photon emission from the laser is determined by the injection current selectively stimulating different transverse modes.

27 Claims, 8 Drawing Sheets

VERTICAL CAVITY SURFACE EMITTING LASER

PRIORITY APPLICATION

This application is a continuation application under 35 U.S.C. §120 of International Application PCT/AU01/01460 filed Nov. 9, 2001, entitled "A Vertical Cavity Surface Emitting Laser," which was published in English on May 16, 2002 as publication WO 02/39554 A1. [This application also claims benefit of priority under 35 U.S.C. §119 to Australian Patent Application PR1377/00 filed Nov. 9, 2000.]

FIELD OF THE INVENTION

The present invention relates to solid state lasers, and in particular to a vertical cavity surface emitting laser, and an optical switch including the laser.

BACKGROUND

Recent advances in vertical cavity surface emitting laser (VCSEL) technology have enabled the production of VCSELs with high intensity beams and low threshold currents, suitable for optical communications applications. Generally, a VCSEL produces a cylindrical laser beam perpendicular to the surface of the wafer on which the VCSEL is fabricated. However, VCSELs have recently been developed that provide the ability to control the angle of emission to some extent by using non-uniform current injection or integrated optical beam routers. This raises the prospect of producing steerable VCSELs suitable for free space optical switching applications. However, the degree of steering has generally been limited in comparison to the beam spot size, making it difficult to produce low crosstalk free-space interconnects. It is desired to provide a VCSEL with improved ability to selectively control the direction of photon emission from the laser, or at least a useful alternative.

SUMMARY OF THE CERTAIN INVENTIVE ASPECTS

In accordance with one aspect of the present invention, there is provided a vertical cavity surface emitting laser, including an active region, an electrical contact for injecting an injection current into the active region in order to generate photons, and an aperture between the active region and the contact for restricting current flow into the active region, the aperture and contact being configured so that the direction of photon emission from the laser is selectively determined by the injection current.

In accordance with another aspect of the present invention, a vertical cavity surface emitting laser for emitting light comprises an active region, an electrical contact for injecting an injection current into the active region in order to generate photons, and an insulating region having an aperture between the active region and the contact for restricting current flow into the active region. The contact has an opening therein that is aligned with respect to the first aperture in the insulating region and that is larger in size than the aperture such that the direction of the light emitted from the laser is selectively determined by the injection current.

Another aspect of the invention comprise an optical switch comprising a vertical cavity surface emitting laser (VCSEL) for emitting a beam of light. The laser comprises an active region, an electrical contact for injecting an injection current into the active region in order to generate photons, and an insulating region having an aperture between the active region and the contact for restricting current flow into the active region. The contact has an opening therein that is larger in size than the aperture and that is disposed with respect to the aperture in the insulating region such that the direction of the beam of light emitted from the laser is selectively determined by the injection current. The optical switch further comprises a first target spatially located such that a substantial portion of the beam of light emitted from the laser is directed onto the first target when the laser is in a first state. The optical switch also includes a second target separate from the first target, the first target being spatially located such that a substantial portion of the beam of light emitted from the laser is redirected onto the second target when the laser is in a first state.

BRIEF DESCRIPTION OF THE DRAWINGS

Preferred embodiments of the present invention are hereinafter described, by way of example only, with reference to the accompanying drawings, wherein.

DETAILED DESCRIPTION OF THE CERTAIN INVENTIVE EMBODIMENTS

Figure 1:
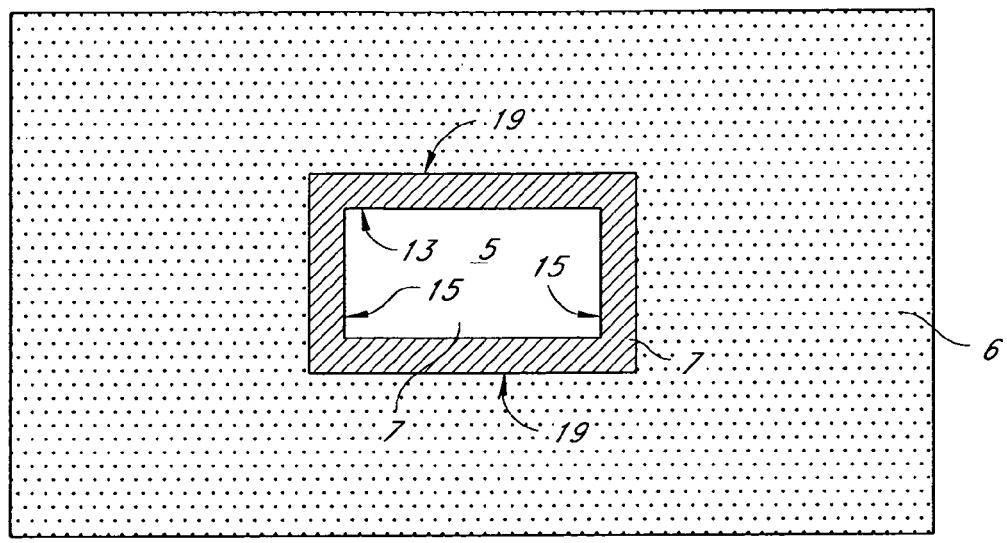
FIG. 1 is a schematic diagram of a preferred embodiment of a steerable vertical cavity surface emitting laser (VCSEL), as viewed from above the VCSEL.
Figure 2:
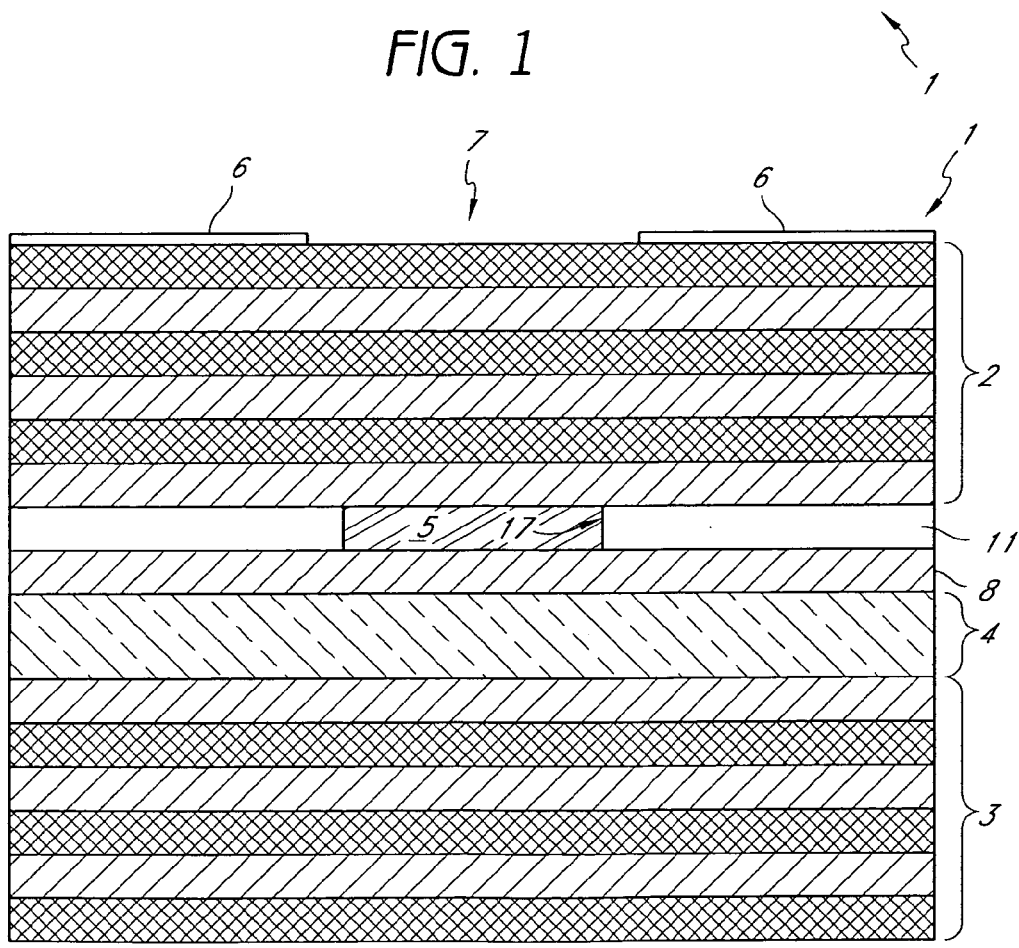
FIG. 2 is a schematic diagram of the VCSEL, as viewed from the side.

FIGS. 1 and 2 show top and side views, respectively, of a VCSEL 1. The VCSEL 1 includes an active lasing region 4 containing five GaAs/AlGaAs quantum wells, top 2 and bottom 3 distributed Bragg reflectors (DBRs), a spacer layer 8 and an aperture 5 for confining the current injected into the active region 4 from a top electrical contact 6 having a central opening 7 therein. The VCSEL 1 was fabricated by metalo-organic chemical vapour deposition (MOCVD) in a vertical, rotating disk reactor (Emcore GS3200) with conventional sources at about 750° C. The DBRs 2, 3 are $Al_{0.92}Ga_{0.08}As/Al_{0.16}Ga_{0.84}As$ multilayers, and the as-grown structure included an aperture layer of AlAs located between the top DBR 2 and the spacer layer 8. After the layers were grown, rectangular mesas with dimensions of about 60 μm×50 μm were formed by chemical etching in order to define each device and to expose the underlying aperture layer for subsequent oxidation.

The aperture 5 was defined by incomplete buried lateral oxidation of the AlAs aperture layer in a furnace at about 425° C. The result of the lateral oxidation step is a buried layer 11 of $Al_2O_3$ with a central, rectangular region 5 of unoxidized AlAs. The surrounding oxide 11 is electrically insulating, and current flowing from the top contact 6 into the active region 4 is therefore restricted to flow through the electrically conductive region or aperture 5 of unoxidized AlAs. It will be appreciated that the aperture 5 can alternatively be defined by other methods, such as proton implantation. Electrons and holes injected into the active region 4 recombine to generate photons whose wavelength is determined by the structure of the quantum wells of the active layer 4. In the case of the VCSEL 1, this wavelength is about 840 nanometers (nm), suitable for free space optical communications. However, by suitable choices of quantum well structures in the active region 4, and top 2 and bottom 3 reflecting DBR structures, the photon wavelength can range from ultraviolet to far infrared wavelengths. The dimensions of the aperture 5 effectively define a laser cavity that generates photons within the active region 4. The resulting photons are reflected back and forth through the active region 4 by the top DBR 2 and bottom DBR 3, acting like the mirrors in a conventional macroscopic laser.

After oxidation, the contact 6 was deposited by thermal e-beam evaporation of gold. The contact 6 includes a rectangular opening 7 defined by sidewalls 19. The rectangular opening 7 preferably has a larger lateral dimension than the aperture 5 at least along one direction. In one preferred embodiment, the rectangular opening 7 has lateral dimensions of about 40 μm×20 μm. The top view of the VCSEL 1 shown in FIG. 1 is a projected view that illustrates the relative sizes and positions of the top contact 6 and the buried aperture 5.

In general, VCSELs have the advantage of operating with a single longitudinal mode due to the short (λ/2) longitudinal cavity dimension defined by the thickness of the active region 4. Transverse modes are produced along the lateral directions of the active region 4, and are determined by the dimensions of the aperture 5, as described above. Prior art VCSELs have used small, symmetric apertures in order to ensure a single transverse mode. That is, their apertures are square, with equal sides 13, 15 of about 4–10 micrometers (μm). In contrast, the VCSEL 1 was fabricated with an asymmetrical aperture 5 having a long dimension 13 of about 18 μm, and a short dimension 15 of approximately 9 μm to allow multiple transverse modes in the longer dimension. The vertical dimension 17 (i.e., perpendicular to the surface) of the aperture 5 is small in order to confine the current and hence limit the number of lobes in that direction to one.

Figure 3:
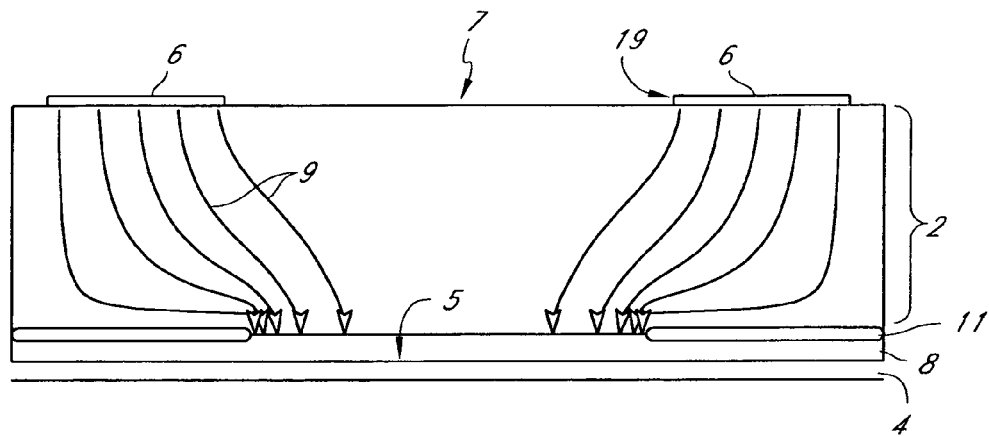
FIG. 3 is a schematic diagram of current flow from a top electrical contact to the active region of the VCSEL.
Figure 4:
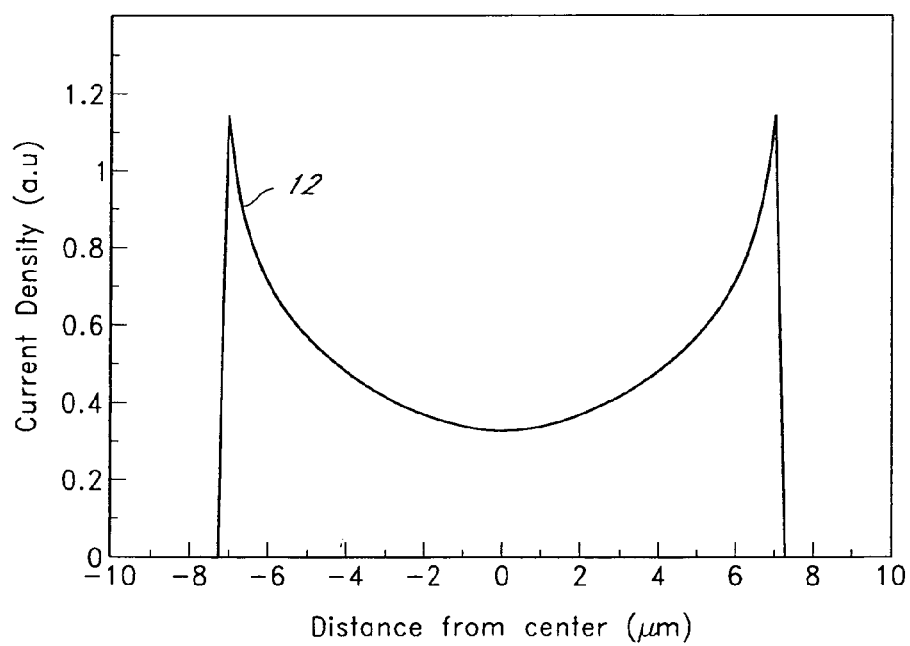
FIG. 4 is a graph of the simulated current density distribution across an aperture of the VCSEL.

Due to the geometry of the top contact 6 and the aperture 5, current flow 9 crowds closer to the edges of aperture 5, as shown in FIG. 3. In particular, the size of the opening 7 in the contact 6 is preferably larger than the than the size of the aperture 5. As a first approximation, the current density across the top of the aperture 5 can be simulated by an iterative procedure based on solving Laplace's equation for the top DBR 2 using appropriate boundary conditions. For the purposes of the simulation, it is assumed that the distribution across the top of the aperture 5 is the same as that across the active region 4. As shown in FIG. 3, the result of such a calculation indicates that the current density 12 is strongly peaked near the edges of the aperture 5 and can be considered to include a constant component that is uniform across the aperture 5 and a non-uniform, current crowding component. The longer edge 13 of the aperture 5 is sufficiently large to support many transverse modes, but two modes near the opposite edges 15 of the aperture 5 are preferentially stimulated due to current crowding. In effect, non-uniform current injection causes two separate beams to be excited in the active region 4 near the edges 15 of the aperture 5.

Figure 5:
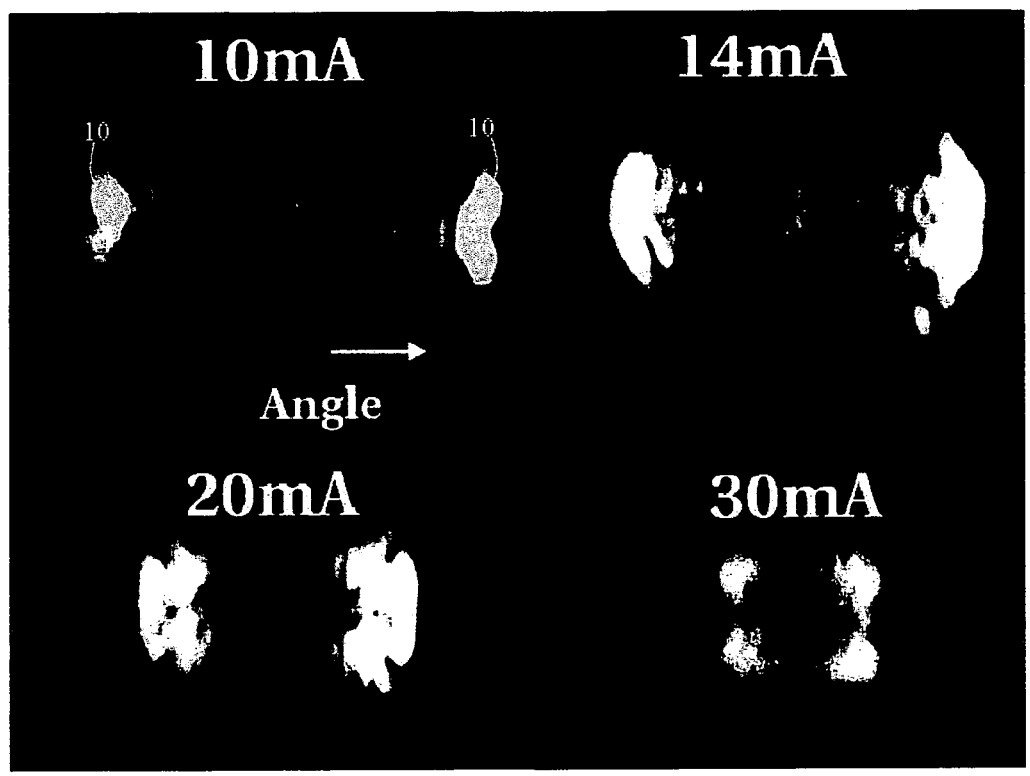
FIG. 5 is a set of far-field images of the optical emission from the VCSEL.

The threshold current for the VCSEL 1 was approximately 8 milliamps (mA), and the maximum current attainable was about 40 mA at continuous wave (CW) excitation. The far-field radiation was measured using a charge-coupled device (CCD) placed behind a screen. Due to the rectangular shape of the aperture, the far-field comprised two main lobes 10, as shown in FIG. 5. The angular separation of lobes 10 from the laser depends on the driving current. At about 10 mA, the lobes 10 are spaced well apart, perhaps ten times the lobe diameter in the steering direction. As the current is increased, to about 14, 20 and 30 mA, the angular separation of the lobes 10 decreases, yet the separation remains significantly larger than the beam spot size.

Figure 6:
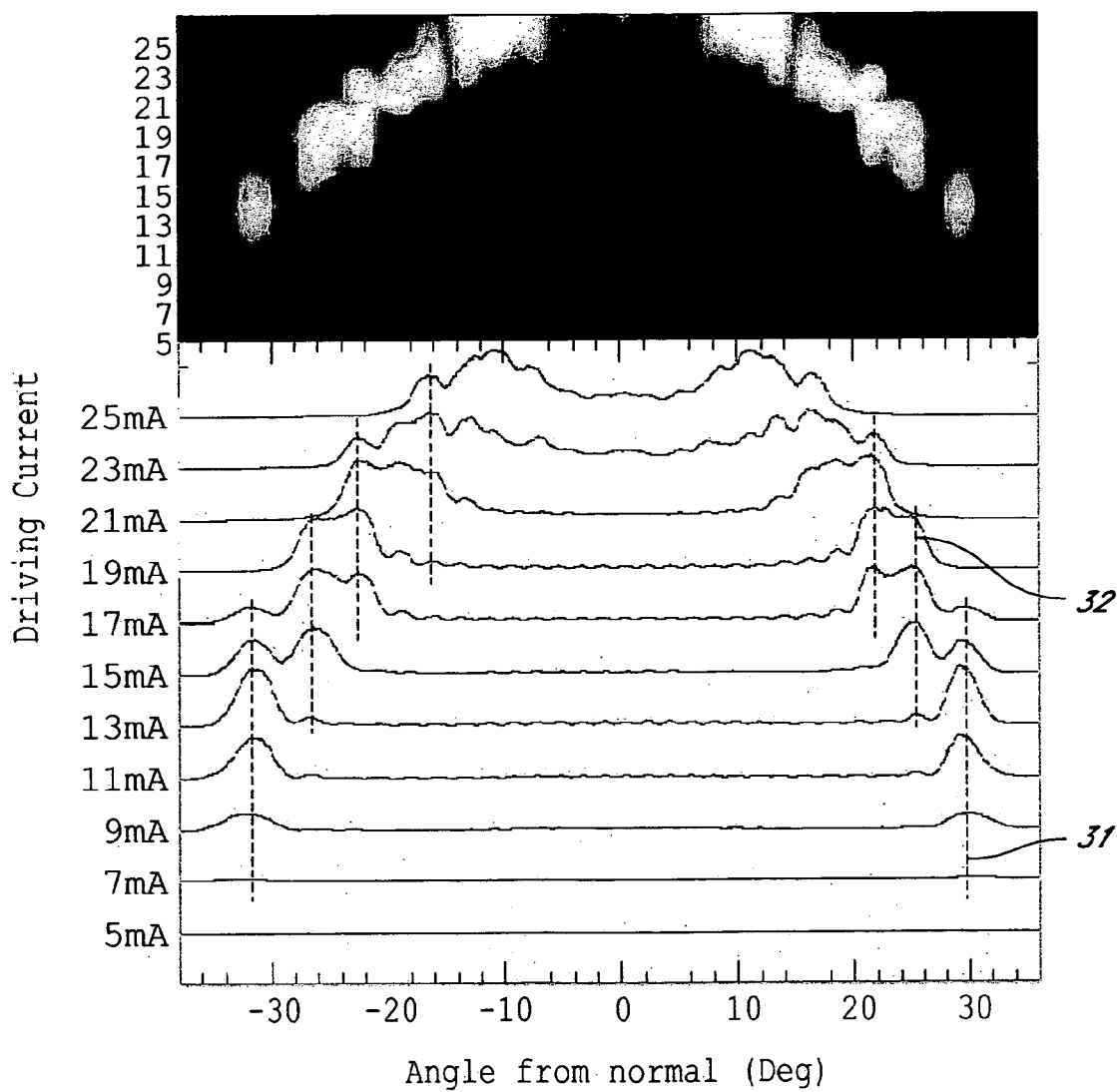
FIG. 6 is a composite figure including a waterfall graph of beam intensity profiles from the VCSEL for several injection currents (bottom), and a composite image of the corresponding far-field images of the beam (top)

To characterize the effect of injection current on the laser beam, the beam profile along the major axis of the laser was measured for values of driving current in the range approximately 5–25 mA. FIG. 6 shows the resulting angular distributions of optical power for several values of driving current. The lower part of FIG. 6 shows the intensity profiles stacked vertically. The intensity profile at each current comprises a superposition of a number of transverse modes, such as those indicated by the dashed lines 31, 32. As the current is increased, transverse modes that are closer to the normal are excited, while those modes that are further from the normal become extinguished due to coupling into the more normal modes. The set of profiles in FIG. 6 demonstrates that the transverse modes do not change their spatial positions, indicating that the cavity dimension does not change appreciably with heating, but rather that the power is redistributed between transverse modes.

Figure 7:
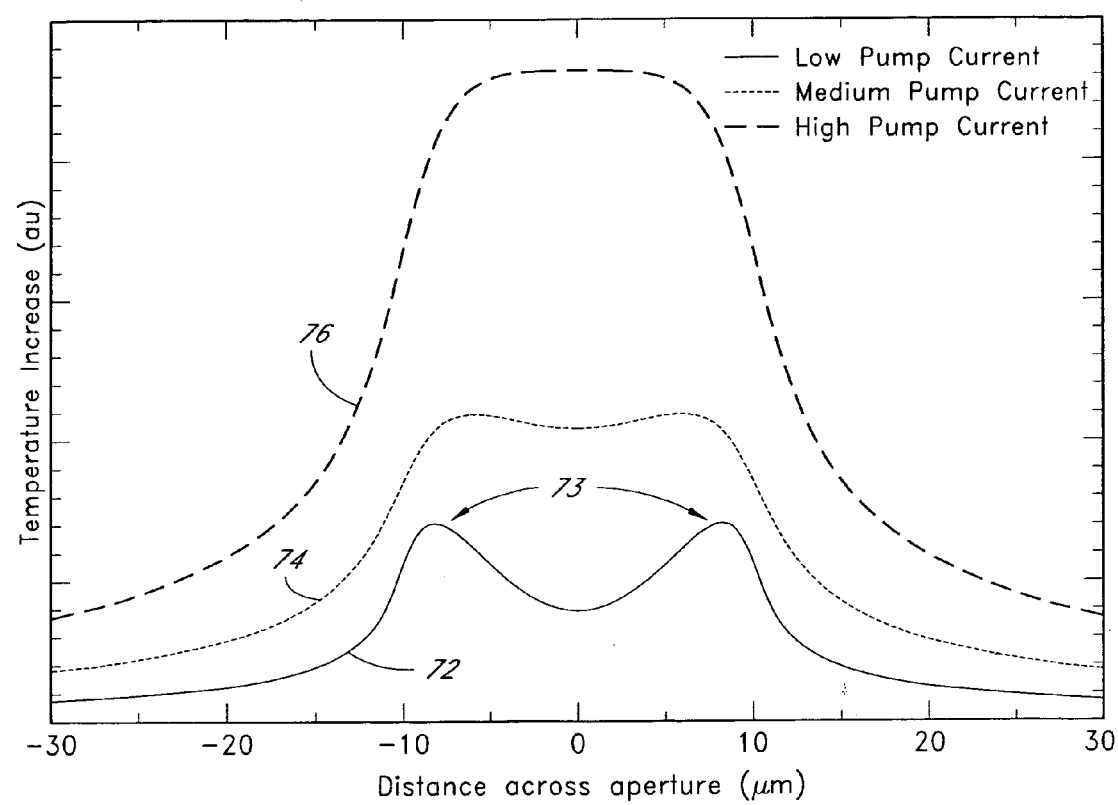
FIG. 7 is a graph of the simulated temperature increase across the aperture.

The steering effect is predominantly due to the formation of a thermal lens in the VCSEL 1. The current crowding gives rise to non-uniform resistive heating across the VCSEL 1. The heating effect can be estimated by solving the heat equation for the top DBR 2 using the simulated current distributions. The results of such a simulation are shown in FIG. 7, which is a graph of temperature increase (in arbitrary units) as a function of position across the top of the aperture 5 for low, medium and high injection currents. At low currents, the solid curve 72 indicates that the greatest heating occurs near the respective edges of the oxide aperture 5 due to current crowding. Because the refractive index increases with increasing temperature, the two peaks 73 of the temperature distribution give rise to two thermal lenses near the edges of the aperture 5, resulting in two distinct beams emitted at angles of more than about 30° from the surface normal, as shown in FIGS. 5 and 6.

At intermediate currents, the entire temperature distribution 74 increases but becomes more uniform, with the two peaks near the edges of the aperture 5 becoming less distinct. At high currents, the peaks disappear altogether, and the distribution 76 assumes a single, broad peaked shape, centered on the aperture 5, giving rise to a single thermal lens. Accordingly, the output lobes 10 from the VCSEL 1 are closer to the surface normal. Thus the optical output characteristics of the VCSEL 1 are caused by two related effects: the non-uniform current injection causes two separate beams to be excited, and the thermal lens effects cause the emission angles of the beams to approach the surface normal as the injection current is increased.

In an alternative embodiment, the oxide aperture 5 is substantially circular, and the VCSEL 1 produces a circular (daisy mode) laser beam whose emission angle is determined by the injection current. However, by breaking the symmetry of the lasing region, such as by using the rectangular aperture 5 of FIG. 1, a more stable output beam is produced. It will be apparent to the skilled in the art that a large variety of asymmetrical shapes, including dumbbell and elliptical shapes, can be used for the aperture 5, but a substantially rectangular shape is preferred. Preferably, however, the aperture 5 is aligned with and smaller than the opening 7 in the contact 6 to provide current crowding. In one preferred embodiment, the aperture 5 and the opening 7 are centered about a common central longitudinal axis through the VCSEL structure, and the opening 7 has a longer lateral dimension in one direction than the buried aperture 5.

Figure 8:
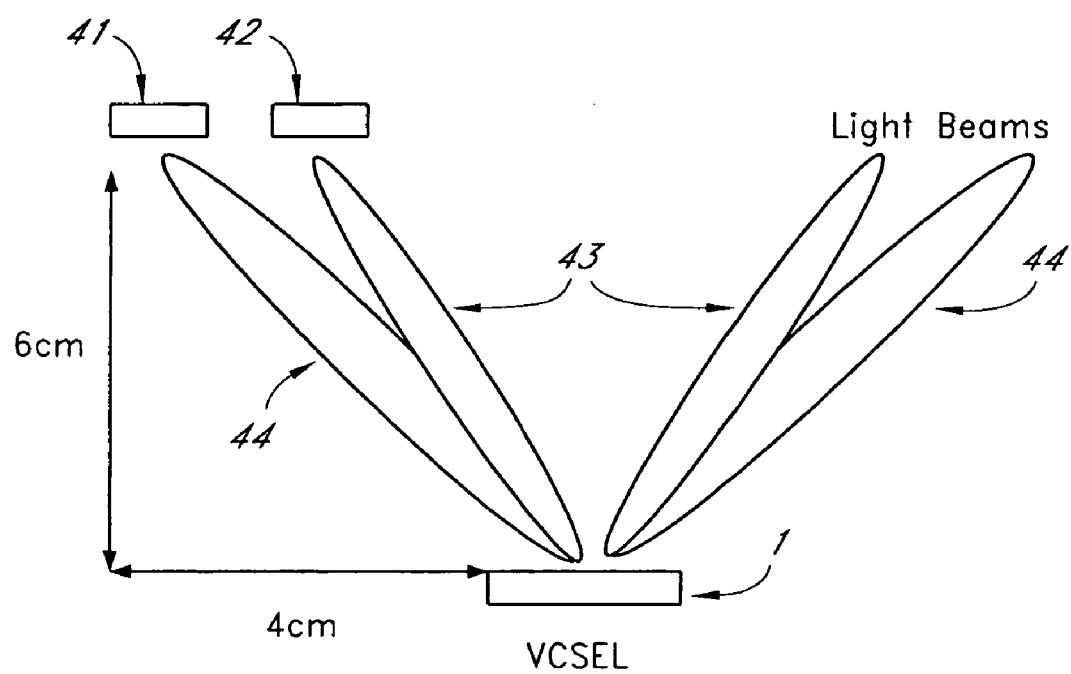
FIG. 8 is a schematic diagram of an experimental arrangement used for measuring the switching performance of the VCSEL.

The ability to control the angle of light emission from the VCSEL 1 can be used for switching in free space optical interconnects. In particular, the VCSEL 1 may be used as an electrically controlled, switched light source. As shown in FIG. 8, this was tested by placing two detectors 41 and 42 above the VCSEL 1. The first detector 41 was placed at a distance of about 6 centimeters (cm) above the laser and 4 cm away from the normal. A second detector 42 was placed at the same height, but about 12 millimeters (mm) closer to the normal. Both detectors had apertures of approximately 3 mm in diameter. Initially, constant currents were injected into the laser, so as to maximize the light power incident on each detector. Under CW excitation, for these particular parameters, the first detector 41 received maximum power when the current was about 16.2 mA. Thus the laser beams are oriented like the outermost beams 44 in FIG. 8. At this current, the power received in the second detector 42 (representing crosstalk) was about 18.2 dB lower than its maximum power. When the current was increased to approximately 26.3 mA, the second detector 42 received its maximum power, which was about 1.7 dB higher than the maximum power detected by the first detector 41. At this current, the laser beams are oriented like the innermost beams 43 in FIG. 8. At this same current, the crosstalk power received at the first detector 41 was about 23 dB lower than the maximum power at the second detector 42.

Figure 9:
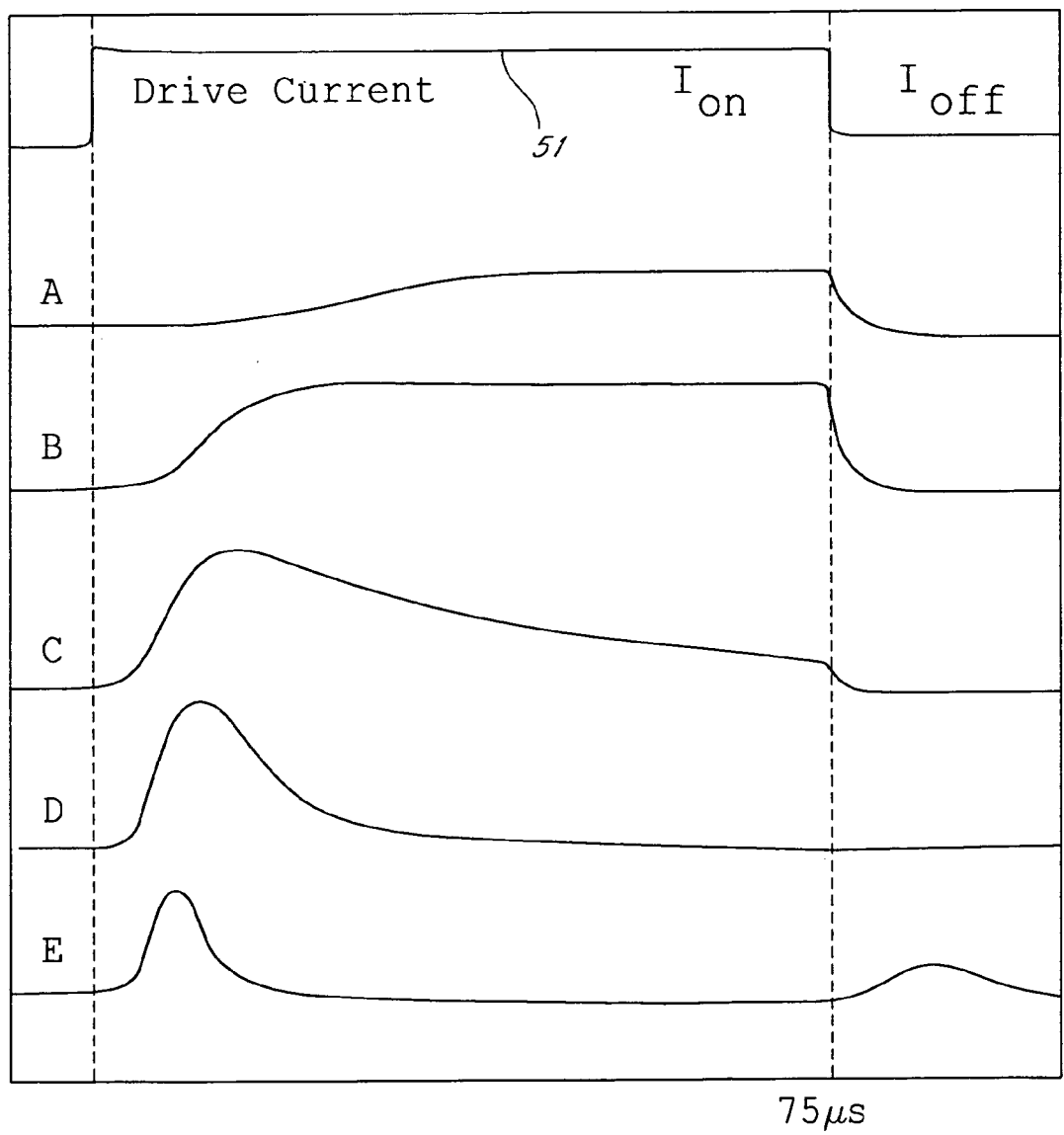
FIG. 9 is a graph of the intensity of light from the VCSEL measured in the second detector of FIG. 8 as a function of time in response to the injection current transient shown at the top of the Figure at different injection current values.
Figure 10:
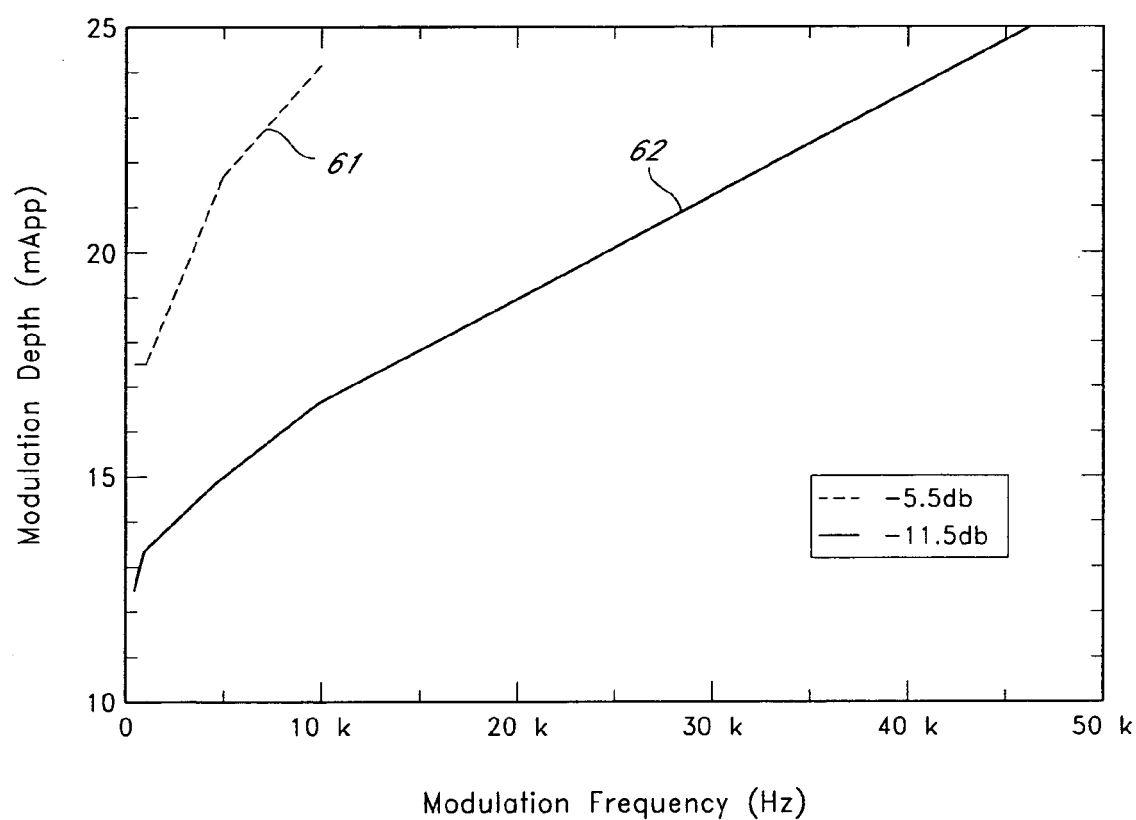
FIG. 10 is a graph showing the relationships between the laser beam modulation amplitude and frequency for constant crosstalk powers of about 5.5 dB and 11.5 dB.

In order to measure the transient behaviour of the VCSEL 1, its input power was modulated using a low duty cycle square wave 51, as shown in FIG. 9. The on time was set at about 75 microseconds (µs). The resulting transient signal from the second detector 42 was measured using an oscilloscope. At first, the off current was set to zero and the on current was set to be approximately 21 mA, which is below the current at which the laser beam points directly at the second detector 42. This caused the beam to slowly move until some of the beam was overlapping with the second detector 42 (Curve A). The on current was then set so that the laser beam was in alignment with the second detector 42, at approximately 26 mA. The detected signal is shown in curve B, indicating that it takes about 20 µs for the beam to reach steady state and realign with the second detector 42.

When the on current was increased further, past the optimal current value, the power at the second detector 42 reached a maximum after approximately 10 µs, and then began to decrease slowly (curve C). This indicates that the beam was steering first into alignment, and then slowly out of alignment past the second detector 42. This observation is further reinforced by curve D, for an on current of about 35 mA. The power at the second detector 42 peaks about 9 µs after the current pulse, and then quickly extinguishes as the beam sweeps completely out of alignment with the second detector 42.

An interesting observation can be seen in curve E, where the on current is set to about 38 mA, and the off current is set to approximately 12 mA. Here, the laser was biased above threshold, even when the pulse is off, and therefore continued to lase as the thermal lens dissipated. This caused a secondary pulse after the current pulse was turned off. This behaviour confirms that thermal lensing is the major factor in the steering behaviour, with the angle of the output beam depending on localised heating of the active region 4.

The above measurements demonstrate that steering is a relatively slow phenomenon, having time constants of the order of several microseconds. However, this is acceptable in an optical switch, where the steering of the laser beam sets up a channel, upon which a fast bit stream is imposed. Providing that the modulation period of the current is much less than the thermal time constant, the signal will be stable. This imposes a minimum modulation frequency on the laser.

In order to measure this time constant, the crosstalk between the two detectors 41, 42 was measured as a function of modulation conditions. In the case of the steerable VCSEL 1, the crosstalk depends on the modulation characteristics as well as the physical separation between the two detectors 41, 42. In order to investigate the dependence of the crosstalk on the modulation characteristics, the average power in the first detector 41 was measured while the beam was aligned with the second detector 42. The amplitude and frequency of the current modulation were then varied.

As the modulation frequency is increased, the modulation amplitude is preferably also increased in order to maintain the same crosstalk power, as shown in FIG. 9 for crosstalk powers of approximately −5.5 dB 61 and −11.5 dB 62. If the modulation frequency was increased beyond about 50 kilohertz (kHz), increasing the modulation amplitude did not result in increases of the crosstalk power. The crosstalk power measured under this high frequency condition was the same as the steady state crosstalk power. Hence in real applications the laser is modulated at a minimum frequency of about 50 kHz, at maximum modulation amplitude. The average power is also maintained constant by using a constant power coding scheme such as Manchester encoding to further stabilize the thermal lens.

Many modifications will be apparent to those skilled in the art without departing from the scope of the present invention as hereinbefore described with reference to the accompanying drawings.

What is claimed is:

1. A vertical cavity surface emitting laser for emitting a photon beam comprising:
   an active region;
   an electrical contact for injecting an injection current into the active region in order to generate photons for emission from the laser, said electrical contact having an opening therein; and
   an aperture between the active region and the contact for restricting current flow from the electrical contact into the active region;
   wherein the opening in the electrical contact does not extend across the entire extent of the laser from one end to an opposing end, and the aperture and contact are configured so that the restricted current flow into the active region causes current crowding near the edges of the aperture such that the direction of photon emission from the laser is selectively determined by the injection current.

2. A vertical cavity surface emitting laser, as claimed in claim 1, wherein the aperture is sufficiently large in at least one transverse dimension for the active region to support multiple transverse modes, the direction of photon emission from the laser being at least partly determined by the injection current selectively stimulating different transverse modes.

3. A vertical cavity surface emitting laser, as claimed in claim 1, wherein the opening in the contact has a lateral dimension larger at least in one direction in comparison to the aperture.

4. A vertical cavity surface emitting laser, as claimed in claim 1, wherein the aperture is asymmetric.

5. A vertical cavity surface emitting laser, for emitting a photon beam, comprising:
   an active region;
   an electrical contact for injecting an injection current into the active region in order to generate photons for emission from the laser; and
   an aperture between the active region and the contact for restricting current flow into the active region;
   wherein the aperture and contact are configured so that the direction of photon emission from the laser is selectively determined by the injection current, the direction of photon emission being variable by more than about 20 degrees with respect to the surface of the laser.

6. A vertical cavity surface emitting laser for emitting a photon beam, comprising:
   an active region;
   an electrical contact for injecting an injection current into the active region in order to generate photons for emission from the laser; and
   an aperture between the active region and the contact for restricting current flow into the active region;
   wherein the aperture and contact are configured so that the direction of photon emission from the laser is selectively determined by the injection current, the angular change of photon emission from the laser being substantially greater than the corresponding angular dimension of the emitted photon beam.

7. A vertical cavity surface emitting laser as claimed in claim 6, wherein the angular change of photon emission from the laser exceeds the corresponding angular dimension of the emitted photon beam in response to a change of injection current of at most about 50%.

8. An optical switch, incorporating a vertical cavity surface emitting laser, the laser comprising:
   an active region,
   an electrical contact for injecting an injection current into the active region in order to generate photons for emission from the laser, said electrical contact having an opening therein; and
   an aperture between the active region and the contact for restricting current flow into the active region;
   wherein the opening in the electrical contact does not extend across the entire extent of the laser from one end to an opposing end, and the aperture and contact are configured so that the restricted current flow into the active region causes current crowding near the edges of the aperture such that the direction of photon emission from the laser is selectively determined by the injection current.

9. An optical switch as claimed in claim 8, wherein the injection current of the laser is modulated at a period substantially shorter than a switching time constant of the laser.

10. An optical switch as claimed in claim 8, wherein the injection current of the laser is modulated using a constant power encoding scheme.

11. An optical switch as claimed in claim 10, wherein the encoding is Manchester encoding.

12. A vertical cavity surface emitting laser for emitting light comprising:
    an active region;
    an electrical contact for injecting an injection current into the active region in order to generate photons; and
    an insulating region having an aperture between the active region and the contact for restricting current flow from the electrical contact into the active region;
    wherein the contact has an opening therein that is aligned with respect to the aperture in the insulating region and that is larger in at least one dimension than the aperture such that the direction of the light emitted from the laser is selectively determined by the injection current, the opening in the electrical contact not extending across the entire extent of the laser from one end to an opposing end.

13. A vertical cavity surface emitting laser, as claim in claim 12, wherein the aperture in the insulating region is substantially rectangular in shape.

14. A vertical cavity surface emitting laser, as claim in claim 13, wherein the opening in the electrical contact region is substantially rectangular in shape.

15. A vertical cavity surface emitting laser, as claim in claim 14, wherein the aperture in the insulating region is shorter in length along at least one lateral direction than the opening in the electrical contact region.

16. A vertical cavity surface emitting laser, as claimed in claim 12, wherein the aperture in the insulating region and the opening in the electrical contact region are centrally aligned along a common axis, the aperture and opening having centers on the common central axis.

17. An optical switch comprising:
    (a) a vertical cavity surface emitting laser for emitting a beam of light comprising:
        an active region;
        an electrical contact for injecting an injection current into the active region in order to generate photons, said electrical contact having an opening therein, the opening in the electrical contact not extending across the entire extent of the laser from one end to an opposing end; and
        an insulating region having an aperture between the active region and the contact for restricting current flow into the active region, the contact having an opening therein that is larger in size than the aperture and that is disposed with respect to the aperture in the insulating region such that the direction of the beam of light emitted from the laser and through the opening is selectively determined by the injection current;
    (b) a first target spatially located such that a substantial portion of the beam of light emitted from the laser is directed onto the first target when the laser is in a first state; and
    (c) a second target separate from the first target, the first target spatially located such that a substantial portion of the beam of light emitted from the laser is redirected onto the second target when the laser is in a second state.

18. An optical switch as claimed in claim 17, wherein at least one of the first target and the second target comprise an optical detector.

19. A vertical cavity surface emitting laser for emitting a photon beam comprising:
   an active region;
   an electrical contact for injecting an injection current into the active region in order to generate photons for emission from the laser, said electrical contact having an opening therein, the opening not extending across the entire extent of the laser from one end to an opposing end; and
   an aperture between the active region and the contact for restricting current flow from the electrical contact into the active region;
   wherein the electrical contact is in the form of a loop disposed around the aperture such that the direction of photon emission from the laser and through the loop is selectively determined by the injection current.

20. A vertical cavity surface emitting laser for emitting a photon beam, comprising:
   an active region;
   an electrical contact for injecting an injection current into the active region in order to generate photons for emission from the laser, the injection current being the only injection current of the laser, said electrical contact having an opening therein; and
   an aperture between the active region and the contact for restricting current flow from the electrical contact into the active region;
   wherein the opening in the electrical contact does not extend across the entire extent of the laser from one end to an opposing end, and the aperture and contact are configured so that the direction of photon emission from the laser is selectively determined by the injection current.

21. A vertical cavity surface emitting laser for emitting a photon beam comprising:
   an active region;
   an electrical contact for injecting an injection current into the active region in order to generate photons for emission from the laser, said electrical contact having an opening therein; and
   an aperture between the active region and the contact for restricting current flow from the electrical contact into the active region,
   wherein the opening in the electrical contact does not extend across the entire extent of the laser from one end to an opposing end, and the aperture and contact are configured such that the direction of photon emission from the laser is selectively determined by the injection current.

22. A vertical cavity surface emitting laser, as claimed in claim 21, wherein the opening in the contact has a lateral dimension larger at least in one direction in comparison to the aperture.

23. A vertical cavity surface emitting laser, as claimed in claim 21, wherein the aperture is asymmetric.

24. A vertical cavity surface emitting laser, as claimed in claim 21, wherein the aperture in the insulating region is substantially rectangular in shape.

25. A vertical cavity surface emitting laser, as claimed in claim 24, wherein the opening in the electrical contact region is substantially rectangular in shape.

26. A vertical cavity surface emitting laser, as claimed in claim 25, wherein the aperture in the insulating region is shorter in length along at least one lateral direction than the opening in the electrical contact region.

27. A vertical cavity surface emitting laser, as claimed in claim 21, wherein the aperture in the insulating region and the opening in the electrical contact region are centrally aligned along a common axis, the aperture and opening having centers on the common central axis.

* * * * *